United States Patent [19]

Fogel et al.

[11] 4,337,434
[45] Jun. 29, 1982

[54] COMPENSATOR FOR SLOWLY RESPONDING SENSORS

[75] Inventors: John D. Fogel, Schwenksville; Will McAdam, Worcester, both of Pa.

[73] Assignee: Leeds & Northrup Company, North Wales, Pa.

[21] Appl. No.: 146,941

[22] Filed: May 2, 1980

[51] Int. Cl.³ .................... H03K 17/74; H03K 5/22
[52] U.S. Cl. ................................. 328/114; 328/132; 307/503
[58] Field of Search .............. 328/132, 114; 307/503

[56] References Cited

U.S. PATENT DOCUMENTS 3,437,833  4/1969  Razaitis et al. .................. 328/114
3,594,726  7/1971  Fleisher .......................... 328/132
3,678,296  7/1972  Day ................................. 328/132
3,978,414  8/1976  Bober et al. ..................... 328/132

Primary Examiner—Stanley D. Miller, Jr.
Assistant Examiner—B. P. Davis
Attorney, Agent, or Firm—Raymond F. MacKay; William G. Miller, Jr.

[57] ABSTRACT

A signal compensating network for use with a sensing element having different rates of response for increasing or decreasing sensed quantities includes a differentiating amplifier having different time constants for increasing and decreasing input signals. The output from the differentiating amplifier is combined with a signal representing the magnitude of the input signal to produce an output.

5 Claims, 1 Drawing Figure

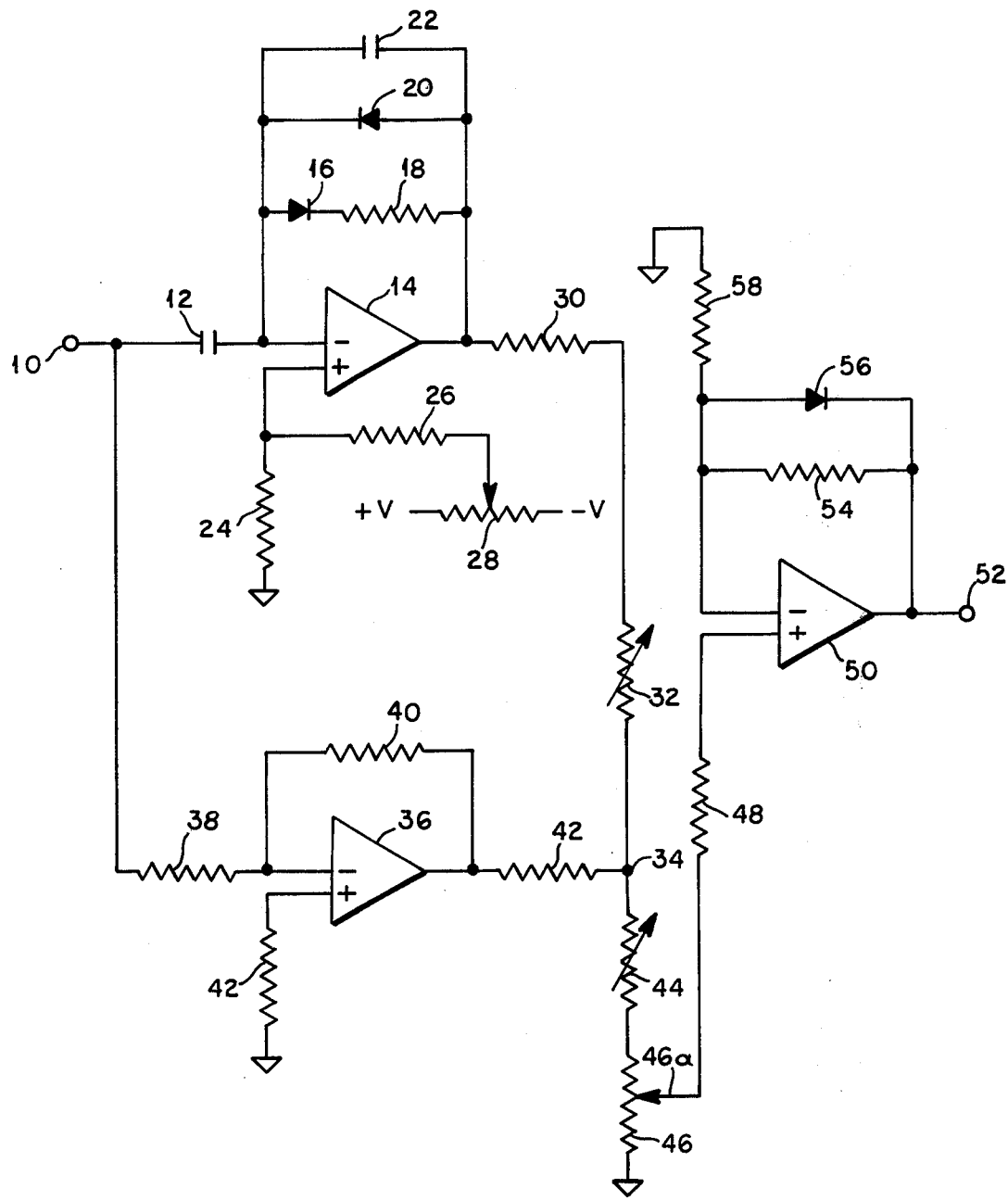

COMPENSATOR FOR SLOWLY RESPONDING SENSORS

BACKGROUND OF THE INVENTION

This invention relates to a signal conditioning circuit and more particularly to a circuit to provide an anticipation effect that differs between whether the signal applied to its input is increasing or decreasing in magnitude.

U.S. Pat. No. 4,076,596 discloses a dissolved gas sensor useful in producing an electrical output signal that varies in accordance with the concentration of the dissolved gas. In utilizing the dissolved gas sensor of U.S. Pat. No. 4,076,596 for measurement and control, it has been noted that the output from one form of the sensor or probe is slow in responding to changes in the concentration of the dissolved gas. It has also been noted that when the sensor is removed from a solution with a low dissolved gas concentration and placed in a solution having high dissolved gas concentration, the output from the sensor responds relatively rapidly whereas when the sensor is removed from a solution of high dissolved gas concentration and placed in a solution having low dissolved gas concentration, the response of the output of the sensor is relatively slow. Additionally, the rate of response of the output of the sensor to changes in the concentration of dissolved gas may be relatively fast when it is moved between solutions with small differences in the concentration of dissolved gas, while for large changes the response time is disproportionately larger.

SUMMARY OF THE INVENTION

In order to utilize the dissolved gas sensor of U.S. Pat. No. 4,076,596 in one of its forms in measurement and control equipment, it has been found desirable to condition the output signal from the sensing element so that the varying response times referred to above are compensated to produce a signal that more closely follows the changes in concentration of the dissolved gas. Attempts have been made to use a simple lead network to condition the signal from the sensor but this has been found to be unsatisfactory in view of the different response times of the output from the sensor for changes in gas concentration in different directions.

In accordance with this invention there is proposed a two branch or channel signal conditioning system in which one branch provides a signal varying in magnitude in accordance with the magnitude of the signal from the sensing element and the other branch provides a signal varying in magnitude in accordance with the rate of change of the magnitude of the signal produced by the sensing element. This other branch additionally provides that the magnitude of the output signal for a particular rate of change of the sensor signal is different depending upon whether the sensor signal is increasing or decreasing. There is also provided in this other branch circuit apparatus for limiting of the magnitude of the signal for extremely high rates of change of the signal applied to its input. The signals from the two branches are combined to produce a compensated output signal that more rapidly reaches and retains a signal level representing the level of concentration of the dissolved gas to which the sensor is exposed.

It is an object of this invention to provide a signal that more faithfully follows the condition to which a sensor is responding when the sensor has an inherent slow response and in which the response differs, depending upon the direction of change in condition to which the sensor is responding.

BRIEF DESCRIPTION OF THE DRAWING

The FIGURE is a schematic diagram of apparatus for conditioning a signal to compensate for slowing responding sensors.

DETAILED DESCRIPTION OF THE PREFERRED EMBODIMENT

The signal conditioning circuit shown in the FIGURE has an input terminal 10 to which is applied a signal or an amplified signal from a sensor such as that described in U.S. Pat. No. 4,076,596. Connected to terminal 10 is a differentiating operational amplifier circuit having an input capacitor 12 connected between the input terminal 10 and the inverting input of an operational amplifier 14. The operational amplifier 14 is provided with a negative feedback circuit including a diode 16 and a resistor 18 connected in series circuit relation between the output of the operational amplifier 14 and the inverting input of the amplifier 14. Also connected between the output of the operational amplifier 14 and its inverting input terminal is a diode 20.

The diodes 16 and 20 placed in the negative feedback circuit in opposite polarity directions may be considered as switches operated in accordance with the difference in signal level between the inverting input of the operational amplifier 14 and its output. If the magnitude of the signal applied to the input terminal 10 is changing in a negative direction, the difference in signal levels between the inverting input of the operational amplifier 14 and its output will cause the diode 20 to conduct to complete the feedback circuit from the output of the operational amplifier 14 to its inverting input terminal to produce substantially no output signal at the output of the operational amplifier 14. However, as diodes are not perfect switches and do have an inherent resistance, there is therefore produced at the output of the operational amplifier 14 a relatively small signal depending in magnitude upon the rate of change of the input signal applied to the input terminal 10.

When the signal applied to the input terminal 10 is changing in a positive direction, diode 16 becomes conducting to provide a negative feedback circuit from the output of the operational amplifier 14 to its inverting input through the resistor 18. Because of the presence of the resistor 18 there will be an output signal from the operational amplifier 14 having a magnitude related to the rate of change of the signal applied to the input terminal 10. It will thus be seen that the feedback circuit including the diodes 16 and 20 and the resistor 18 will provide an output signal from the operational amplifier 14 that for a given rate of change of signal applied to the input terminal 10 will be larger for one direction of change than for the other. This characteristic of the signal conditioning apparatus produces an output which will rapidly assume and retain the desired final level. It is to be understood that with the different response times for the sensor for different directions of change that if compensation were accomplished for the slow direction of change using a conventional lead network, that the compenstion signal would be so large as to produce objectionable overshoot in the fast direction of change. Conversely, if the circuit was properly adjusted for the fast direction of change, it would not provide sufficient compensation for the slow direction of change.

It is to be understood that while there has been no resistor shown connected in the feedback branch including the diode 20, that if a larger compensation signal is desired for the fast response direction of change, a resistor may be introduced in series with the diode 20 to provide additional output signal from the operational amplifier 14 for signal changes that cause the diode 20 to become conducting.

Also connected from the output of the operational amplifier 14 to its inverting input terminal is a capacitor 22. This capacitor is provided to prevent large output signals appearing at the output of operational amplifier 14 for extremely fast changes of signal applied to the input terminal 10. In the normal use of this circuit with a sensor as disclosed in U.S. Pat. No. 4,076,596, the input signal applied to the input terminal 10 will not undergo rapid changes. However, in some applications it may be desirable to include between the sensor and the input terminal 10 of the signal compensating circuit switching devices for example to select temperature compensation effects or to provide for different ranges of sensor operation. In such a case, switching action could produce rapid changes in signal level at the input terminal 10 and to prevent such rapid changes from producing large output signals from the differentiating operational amplifier 14, negative feedback capacitor 22 is provided to reduce the high frequency gain of the amplifier 14.

A conventional biasing circuit comprising resistors 24 and 26 and a potentiometer 28 is provided to allow for adjustment of the current into the non-inverting input terminal of the operational amplifier 14 so that the output from the operational amplifier 14 may be adjusted to zero for zero rate of change of the input signal applied to the input terminal 10.

The output from the operational amplifier 14 which is a signal of magnitude varying in accordance with the rate of change of the signal applied to the input terminal 10 is connected by way of a resistor 30 and an adjustable resistor 32 to a summing point or junction 34. The adjustable resistor 32 permits the relative magnitude of the signal from operational amplifier 14 to the summing junction 34 to be varied.

In addition to the signal branch or channel including the operational amplifier 14, there is provided a second branch or channel including an operational amplifier 36. The operational amplifier 36 has its inverting input connected through a resistor 38 to the input terminal 10 and includes a negative feedback resistor 40. The resistors 38 and 40 are selected so that the operational amplifier 36 operates to provide at its output a signal which bears a desired ratio to the signal applied to the input terminal 10. A resistor 42 connected between signal common and the non-inverting input of operational amplifier 36 is selected so that the off-set of the operational amplifier 36 can be balanced to zero for zero signal applied to the input terminal 10. The output from the operational amplifier 36 is connected by way of a resistor 42 to the summing junction 34 where it is summed with the output signal from the operational amplifier 14.

Between the summing junction 34 and signal common there is connected an adjustable resistor 44 and a potentiometer 46. The adjustable resistor 44 and the potentiometer 46 are included in the circuit to provide for calibration adjustment for the circuit to accommodate sensors having different sensitivities or for changes in the sensitivity of any sensor connected to input terminal 10 that may vary with time. The output signal from the potentiometer 46 appearing at a tap 46a is connected by way of a resistor 48 to a non-inverting input terminal of an operational amplifier 50. The operational amplifier 50 serves as a buffer amplifier between the summing junction 34 and an output terminal 52 of the signal compensating circuit.

The operational amplifier 50 is provided with a negative feedback circuit from its output to its inverting input by way of a resistor 54 and a diode 56. The diode 56 is included to provide a downscale limit for the output of operational amplifier 50 which is useful in subduing the effects of transients that may occur at the output terminal 52 during turn-on of the signal compensator. The inverting input of the operational amplifier 50 is connected by way of a resistor 58 to signal common.

The circuitry shown in the FIGURE consisting of a first signal channel including the operational amplifier 14 and second signal channel including the operational amplifier 36 provides an output signal at output terminal 52 having a rate of change component related to the magnitude of the rate of change of signal applied to the input terminal 10 and the direction in which the signal at the input terminal 10 is changing to more closely follow the magnitude of the condition to which a slowly responding nonsymmetrical sensor is subjected.

While a single embodiment of the invention has been disclosed in the FIGURE, it is to be understood that the invention is not limited to this embodiment but covers any embodiment coming within the scope of the claims.

What is claimed is:

1. A signal compensating circuit to provide a compensated output signal having a rapid response from an input signal from a sensing element with a slowly responding output, said sensing element having different response times for changes of the sensed quantity in opposite directions comprising:

input means for connection to said sensing element, first signal channel means having an input connected to said input means and an output for producing an output signal at its output varying in magnitude proportionally in accordance with the magnitude of the rate of change of the signal applied to its input;

second signal channel means having an input connected to said input means and an output for producing an output signal at its output which varies in magnitude proportionally in accordance with the magnitude of the signal applied to its input, combining means connected to said outputs of said first and second signal channel means for combining said output signals from said signal channel means to produce said compensated output signal, and direction sensitive means in said first signal channel means for providing a first proportion between the magnitude of its output signal and the magnitude of the rate of change of said signal applied to said input of said first signal channel means when said signal is changing in one direction and to provide a second proportion between the magnitude of its output signal and the magnitude of the rate of change of said signal applied to said input of said first signal channel means when said signal is changing in the other direction.

2. A signal compensating circuit as claimed in claim 1 in which said first signal channel means includes means for limiting the output signal from said first signal channel means for rapid rates of change of said signal applied to said input of said first signal channel means.

3. A signal compensating means as claimed in claim 1 in which said first signal channel means includes a differentiating operational amplifier for producing said output signal at its output varying in magnitude proportional in accordance with the magnitude of the rate of change in the signal applied to its input.

4. A signal compensating circuit as claimed in claim 3 in which said direction sensitive means includes
- a first and second negative feedback circuit for said operational amplifier,
- a first diode connected in said first feedback circuit that conducts when said signal applied to the input of said first signal channel means is changing in one direction,
- a second diode connected in said second feedback circuit that conducts when said signal applied to the input of said first signal channel is changing in the other direction, and
- a resistor connected in series with one of said diodes.

5. A signal compensating circuit comprising:
- an input terminal;
- first amplifier means having an input, an output, and a negative feedback circuit;
- a capacitor connected between said input terminal and said input of said first amplifier means;
- a pair of diodes connected in parallel in reversed polarity in said negative feedback circuit;
- a resistor connected in series with one of said diodes;
- a second amplifier means having an input, an output, and a negative feedback circuit;
- first resistance means connected between said input terminal and said input of said second amplifier means;
- second resistance means connected in said negative feedback circuit of said second amplifier means;
- buffer amplifier means having an input, an output, and a negative feedback circuit; and
- means connecting said input of said buffer amplifier means to said outputs of said first and second amplifier means.

* * * * *